(12) United States Patent
Hayashi

(10) Patent No.: US 12,519,453 B2
(45) Date of Patent: Jan. 6, 2026

(54) ACOUSTIC WAVE DEVICE

(71) Applicant: Murata Manufacturing Co., Ltd., Nagaokakyo (JP)

(72) Inventor: Yasunobu Hayashi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 932 days.

(21) Appl. No.: 17/724,754

(22) Filed: Apr. 20, 2022

(65) Prior Publication Data

US 2022/0247377 A1    Aug. 4, 2022

Related U.S. Application Data

(63) Continuation of application No. PCT/JP2020/040408, filed on Oct. 28, 2020.

(30) Foreign Application Priority Data

Oct. 30, 2019 (JP) .................................. 2019-197792

(51) Int. Cl.
*H03H 9/145* (2006.01)
*H03H 3/08* (2006.01)
(Continued)

(52) U.S. Cl.
CPC .......... *H03H 9/14541* (2013.01); *H03H 3/08* (2013.01); *H03H 9/02866* (2013.01); *H03H 9/25* (2013.01)

(58) Field of Classification Search
CPC .. H03H 9/14541; H03H 3/08; H03H 9/02866; H03H 9/25; H03H 9/02574;
(Continued)

(56) References Cited

U.S. PATENT DOCUMENTS 5,773,917 A * 6/1998 Satoh ....................... H03H 3/08
310/313 A
2002/0113526 A1 8/2002 Nishihara
(Continued)

FOREIGN PATENT DOCUMENTS

JP  07-122961 A   5/1995
JP  2002-185283 A 6/2002
(Continued)

OTHER PUBLICATIONS

Official Communication issued in International Patent Application No. PCT/JP2020/040408, mailed on Dec. 1, 2020.

*Primary Examiner* — Dominick L Plakkoottam
(74) *Attorney, Agent, or Firm* — Keating & Bennett, LLP

(57) ABSTRACT

An acoustic wave device includes a piezoelectric substrate and an electrode on the piezoelectric substrate and including first and second layers. The first layer includes Al and Cu. The second layer is on a side opposite to a piezoelectric substrate side of the first layer and includes Al. The first layer includes an Al crystal and at least a portion of $CuAl_2$ crystal grains that are provided in a direction orthogonal or substantially orthogonal to a thickness direction of the piezoelectric substrate. In the electrode, the $CuAl_2$ crystal grains do not extend to the main surface of the second layer on a side opposite to a first layer side.

15 Claims, 9 Drawing Sheets

(51) Int. Cl.
*H03H 9/02* (2006.01)
*H03H 9/25* (2006.01)

(58) Field of Classification Search
CPC .......... H03H 9/02157; H03H 9/02929; H03H 9/02818; H03H 9/145
See application file for complete search history.

(56) References Cited

U.S. PATENT DOCUMENTS

2003/0146674 A1    8/2003   Jacot et al.
2020/0186124 A1*   6/2020   Kasamatsu ........ H03H 9/14502

FOREIGN PATENT DOCUMENTS

| | | | |
|---|---|---|---|
| JP | 3445971 B2 * | 9/2003 |
| JP | 2005-151063 A | 6/2005 |
| JP | 2005-516517 A | 6/2005 |
| JP | 2007-013815 A | 1/2007 |
| JP | 2018014715 A * | 1/2018 |
| WO | 2019/009373 A1 | 1/2019 |

* cited by examiner

ACOUSTIC WAVE DEVICE

CROSS REFERENCE TO RELATED APPLICATIONS

This application claims the benefit of priority to Japanese Patent Application No. 2019-197792 filed on Oct. 30, 2019 and is a Continuation application of PCT Application No. PCT/JP2020/040408 filed on Oct. 28, 2020. The entire contents of each application are hereby incorporated herein by reference.

BACKGROUND OF THE INVENTION

1. Field of the Invention

The present invention relates to an acoustic wave device, and more particularly to an acoustic wave device including an electrode.

2. Description of the Related Art

As an acoustic wave device, a surface acoustic wave element including a piezoelectric substrate and an electrode formed on the piezoelectric substrate has been known (for example, see Japanese Unexamined Patent Application Publication No. 2007-13815).

In the surface acoustic wave element described in Japanese Unexamined Patent Application Publication No. 2007-13815, the electrode has a layer containing aluminum and copper. In this layer, columnar crystal grains made of an aluminum-copper alloy are formed at a crystal grain boundary of columnar crystal grains made of aluminum.

In the surface acoustic wave element described in Japanese Unexamined Patent Application Publication No. 2007-13815, when a copper concentration of the electrode is increased in order to further improve the power durability, there has been a problem in that the electrical resistance increases and characteristics of the surface acoustic wave element tend to deteriorate.

SUMMARY OF THE INVENTION

Preferred embodiments of the present invention provide acoustic wave devices that are each able to improve power durability while reducing or preventing deterioration in characteristics.

An acoustic wave device according to a preferred embodiment of the present invention includes a piezoelectric substrate and an electrode. The electrode is on the piezoelectric substrate. The electrode includes a first layer and a second layer. The first layer includes Al and Cu. The second layer is on a side opposite to a piezoelectric substrate side of the first layer and includes Al. The first layer includes an Al crystal and at least a portion of $CuAl_2$ crystal grains that are provided in a direction orthogonal or substantially orthogonal to a thickness direction of the piezoelectric substrate. In the electrode, the $CuAl_2$ crystal grains do not extend to a main surface of the second layer on a side opposite to a first layer side.

An acoustic wave device according to a preferred embodiment of the present invention includes a piezoelectric substrate and an electrode. The electrode is on the piezoelectric substrate. The electrode includes a first layer and a second layer. The first layer includes Al and Cu. The second layer is on a side opposite to a piezoelectric substrate side of the first layer and includes Cu. The first layer includes an Al crystal and $CuAl_2$ crystal grains that are arranged in a direction orthogonal or substantially orthogonal to a thickness direction of the piezoelectric substrate. In the electrode, the $CuAl_2$ crystal grains do not extend to a main surface of the second layer on a side opposite to a first layer side.

The acoustic wave devices according to preferred embodiments of the present invention are each able to improve power durability while reducing or preventing degradation in characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
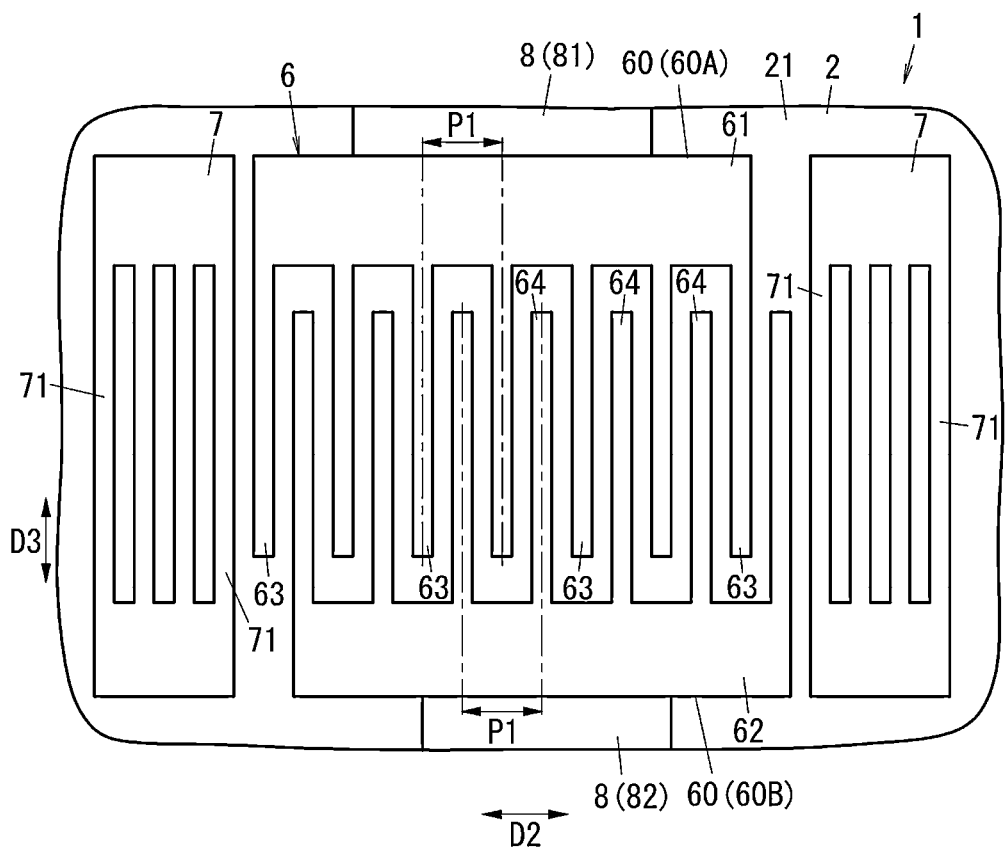
FIG. 1 is a plan view of an acoustic wave device according to Preferred Embodiment 1 of the present invention.
Figure 2:
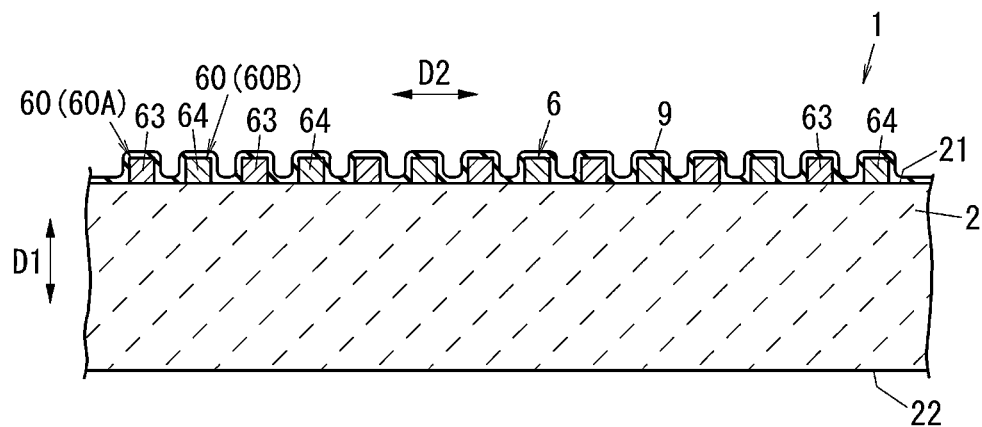
FIG. 2 is a sectional view of the acoustic wave device in FIG. 1.

Preferred embodiments of the present invention will be described below with reference to the drawings.

FIGS. 1 to 4, 6A to 6F, 7, and 9 to 13 referred to in the following preferred embodiments and the like are all schematic diagrams, and ratios of sizes and thicknesses of components in the diagrams do not necessarily reflect actual dimensional ratios.

Preferred Embodiment 1

(1) Overall Configuration of Acoustic Wave Device

Hereinafter, an acoustic wave device 1 according to Preferred Embodiment 1 of the present invention will be described with reference to FIGS. 1 to 5.

The acoustic wave device 1 includes a piezoelectric substrate 2 and an interdigital transducer (IDT) electrode 6. The IDT electrode 6 is provided on the piezoelectric substrate 2. The IDT electrode 6 includes two electrodes 60.

In addition, the acoustic wave device 1 further includes two reflectors 7. The two reflectors 7 are provided on the piezoelectric substrate 2. The two reflectors 7 are located opposite sides of the IDT electrode 6 in a direction along a propagation direction of the acoustic wave of the acoustic wave device 1.

In addition, the acoustic wave device 1 further includes a wiring portion 8 connected to the IDT electrode 6. The wiring portion 8 is provided on the piezoelectric substrate 2.

In addition, the acoustic wave device 1 further includes a protective film 9 (see FIG. 2) covering the IDT electrode 6, the reflectors 7, and the wiring portions 8 on the piezoelectric substrate 2. The protective film 9 is not illustrated in FIG. 1. The acoustic wave device 1 may not include the protective film 9.

In the acoustic wave device 1, one IDT electrode 6 is provided on the piezoelectric substrate 2, but the number of the IDT electrodes 6 is not limited to one, and may be plural. That is, the acoustic wave device 1 may include a plurality of IDT electrodes 6. In this case, in the acoustic wave device 1, for example, a band-pass filter may be configured by electrically connecting a plurality of surface acoustic wave resonators including the plurality of IDT electrodes 6.

(2) Components of Acoustic Wave Device

(2.1) Piezoelectric Substrate

In the acoustic wave device 1 according to Preferred Embodiment 1, the piezoelectric substrate 2 includes, for example, lithium tantalate (LiTaO$_3$). The piezoelectric substrate is made of, for example, a Γ° Y-cut X-propagation LiTaO$_3$ piezoelectric single crystal. When three crystal axes of a LiTaO$_3$ piezoelectric single crystal are defined as an X-axis, a Y-axis, and a Z-axis, the Γ° Y-cut X-propagation LiTaO$_3$ piezoelectric single crystal is a LiTaO$_3$ single crystal in which a surface acoustic wave propagates in the X-axis direction, and obtained by cutting the LiTaO$_3$ piezoelectric single crystal along a plane having, as a normal line, an axis that is rotated about the X-axis as the center axis by Γ° from the Y-axis in a Z-axis direction. The cut angle of the piezoelectric substrate is Γ=θ+90° where Γ [°] is the cut angle and (φ, θ, ψ) is the Euler angles of the piezoelectric substrate. Here, Γ and Γ±180×n are synonymous (crystallographically equivalent). Here, n is a natural number. The piezoelectric substrate is not limited to a Γ° Y-cut X-propagation LiTaO$_3$ piezoelectric single crystal, and may be, for example, a Γ° Y-cut X-propagation LiTaO$_3$ piezoelectric ceramic.

The piezoelectric substrate 2 includes a first main surface 21 and a second main surface 22 facing each other. The first main surface 21 and the second main surface 22 face each other in a thickness direction D1 of the piezoelectric substrate 2. In a plan view from the thickness direction D1 of the piezoelectric substrate 2, the shape of the piezoelectric substrate 2 is a rectangular or substantially rectangular shape, but is not limited thereto, and may be, for example, a square or substantially square shape.

The material of the piezoelectric substrate is not limited to lithium tantalate (LiTaO$_3$), and may be, for example, lithium niobate (LiNbO$_3$), zinc oxides (ZnO), aluminum nitrides (AlN), or lead zirconate titanate (PZT). In a case where the piezoelectric substrate is made of, for example, a Y-cut X-propagation LiNbO$_3$ piezoelectric single crystal or piezoelectric ceramics, the acoustic wave device 1 can use a mode having an SH wave as a main component as a main mode by using a Love wave as an acoustic wave. The single crystal material and the cut angle of the piezoelectric substrate may be appropriately determined in accordance with, for example, required specifications or the like of a filter (for example, filter characteristics such as a bandpass characteristic, an attenuation characteristic, temperature characteristics, and a band width).

(2.2) IDT Electrode

The IDT electrode 6 is provided on the piezoelectric substrate 2. More specifically, the IDT electrode 6 is provided on the first main surface 21 of the piezoelectric substrate 2.

As described above, the IDT electrode 6 includes two electrodes 60. Each of the two electrodes 60 is electrically conductive. The two electrodes 60 are spaced apart from each other and electrically insulated from each other. In the following description, when the two electrodes 60 are distinguished from each other, one electrode 60 of the two electrodes 60 is referred to as a first electrode 60A and the other electrode 60 is referred to as a second electrode 60B.

The first electrode 60A has a comb shape in a plan view from the thickness direction D1 of the piezoelectric substrate 2. The first electrode 60A includes a first busbar 61 and a plurality of first electrode fingers 63. The first busbar 61 is a conductor portion provided to make the plurality of first electrode fingers 63 be at the same potential. The second electrode 60B has a comb shape in a plan view from the thickness direction D1 of the piezoelectric substrate 2. The second electrode 60B includes a second busbar 62 and a plurality of second electrode fingers 64. The second busbar 62 is a conductor portion provided to make the plurality of second electrode fingers 64 be at the same potential (equipotential). In the IDT electrode 6, the first busbar 61 and the second busbar 62 face each other.

The plurality of first electrode fingers 63 are connected to the first busbar 61 and extend toward the second busbar 62 side. The plurality of first electrode fingers 63 are integrally provided with the first busbar 61 and are spaced apart from the second busbar 62.

The plurality of second electrode fingers 64 are connected to the second busbar 62 and extend toward the first busbar 61 side. The plurality of second electrode fingers 64 are integrally provided with the second busbar 62, and are spaced apart from the first busbar 61.

The IDT electrode 6 is, for example, a normal IDT electrode. Hereinafter, the IDT electrode 6 will be described in more detail.

The first busbar 61 and the second busbar 62 of the IDT electrode 6 have an elongated shape in which a longitudinal direction corresponds to a second direction D2 orthogonal or substantially orthogonal to the thickness direction D1 (first direction) of the piezoelectric substrate 2. In other words, the first busbar 61 and the second busbar 62 of the IDT electrode 6 each have an elongated shape in which a longitudinal direction is the second direction D2 that is the acoustic wave propagation direction. In the IDT electrode 6, the first busbar 61 and the second busbar 62 face each other in a third direction D3 orthogonal or substantially orthogonal to both the thickness direction D1 and the second direction D2 of the piezoelectric substrate 2. In other words, the first busbar 61 and the second busbar 62 face each other in the third direction D3, which is a direction in which the first electrode fingers 63 and the second electrode fingers 64, described later, extend.

The plurality of first electrode fingers 63 are connected to the first busbar 61 and extend toward the second busbar 62. Here, the plurality of first electrode fingers 63 extend from the first busbar 61 along the third direction D3. Tips of the plurality of first electrode fingers 63 are spaced apart from the second busbar 62. For example, the plurality of first electrode fingers 63 have the same or substantially the same length and the same or substantially the same width.

The plurality of second electrode fingers 64 are connected to the second busbar 62 and extend toward the first busbar 61. Here, the plurality of second electrode fingers 64 extend from the second busbar 62 along the third direction D3. Tips of the plurality of second electrode fingers 64 are spaced apart from the first busbar 61. For example, the plurality of second electrode fingers 64 have the same or substantially the same length and the same or substantially the same width. In the example of FIG. 1, the length of the plurality of second electrode fingers 64 is the same or substantially the same as the length of the plurality of first electrode fingers 63. Further, in the example of FIG. 1, the width of the plurality of second electrode fingers 64 is the same or substantially the same as the width of the plurality of first electrode fingers 63.

In the IDT electrode 6, the plurality of first electrode fingers 63 and the plurality of second electrode fingers 64 are alternately provided in the second direction D2 so as to be spaced apart from each other. Therefore, the adjacent first electrode fingers 63 and second electrode fingers 64 are spaced apart from each other. A group of electrode fingers including the plurality of first electrode fingers 63 and the plurality of second electrode fingers 64 may have any configuration as long as a configuration in which the plurality of first electrode fingers 63 and the plurality of second electrode fingers 64 are spaced apart from each other in the second direction D2, and may have a configuration in which the plurality of first electrode fingers 63 and the plurality of second electrode fingers 64 are not alternately arranged so as to be spaced apart from each other. For example, a region in which the first electrode fingers 63 and the second electrode fingers 64 are spaced apart one by one and a region in which two first electrode fingers 63 or two second electrode fingers 64 are provided in the second direction D2 may be mixed.

The IDT electrode 6 includes an intersection region defined by the plurality of first electrode fingers 63 and the plurality of second electrode fingers 64. The intersection region is a region between the envelopes of the tips of the plurality of first electrode fingers 63 and the envelopes of the tips of the plurality of second electrode fingers 64. The IDT electrode 6 excites acoustic waves in the piezoelectric substrate 2 in the intersection region.

The IDT electrode 6 is a normal IDT electrode, but is not limited thereto, and, may be, for example, an IDT electrode apodization weighted or an inclined IDT electrode. In the apodization weighted IDT electrode, the intersection width increases from one end portion toward the center in the propagation direction of the acoustic wave, and decreases from the center toward the other end portion in the propagation direction of the acoustic wave.

As illustrated in FIG. 1, an electrode finger pitch P1 of the IDT electrode 6 is defined by a distance between center lines of two adjacent first electrode fingers 63 among the plurality of first electrode fingers 63 or a distance between center lines of two adjacent second electrode fingers 64 among the plurality of second electrode fingers 64. The distance between the center lines of two adjacent second electrode fingers 64 is the same as the distance between the center lines of two adjacent first electrode fingers 63.

In the IDT electrode 6 of the acoustic wave device 1 according to Preferred Embodiment 1, the number of pairs of the first electrode fingers 63 and the second electrode fingers 64 is, for example, one hundred. That is, the IDT electrode 6 includes, for example, one hundred first electrode fingers 63 and one hundred second electrode fingers 64.

A specific structure of each of the two electrodes 60 will be described later in the section "(3) Structure of Electrode".

(2.3) Reflector

In the acoustic wave device 1, the two reflectors 7 are provided on the first main surface 21 of the piezoelectric substrate 2. Each of the two reflectors 7 is electrically conductive. Each of the two reflectors 7 is, for example, a short-circuited grating. Each reflector 7 reflects an acoustic wave.

Each of the two reflectors 7 includes a plurality of electrode fingers 71, and one ends of the plurality of electrode fingers 71 are short-circuited to each other and the other ends thereof are short-circuited to each other. In each of the two reflectors 7, the number of electrode fingers is twenty, for example. In the acoustic wave device 1 according to Preferred Embodiment 1, each reflector 7 is, for example, a short-circuited grating, but is not limited thereto, and may be, for example, an open grating, a positive-negative reflection grating, a grating in which a short-circuited grating and an open grating are combined, or the like.

In the acoustic wave device 1, in the case where the reflectors 7 and the IDT electrode 6 are made of the same material and have the same or substantially the same thickness, the reflectors 7 and the IDT electrode 6 can be formed in the same procedure when the acoustic wave device 1 is manufactured. A non-limiting example of a method of manufacturing the acoustic wave device 1 will be described later in the section "(4) Method of Manufacturing Acoustic Wave Device".

In the acoustic wave device 1, each reflector 7 is, for example, a short-circuited grating, but is not limited thereto, and may be, for example, an open grating, a positive-negative reflection grating, or the like.

(2.4) Wiring Portion

In the acoustic wave device 1, as illustrated in FIG. 1, the wiring portion 8 is provided on the first main surface 21 of the piezoelectric substrate 2. The wiring portion 8 has conductivity.

The wiring portion 8 includes a first wiring portion 81 connected to the first busbar 61 of the IDT electrode 6 and a second wiring portion 82 connected to the second busbar 62 of the IDT electrode 6. The first wiring portion 81 and the second wiring portion 82 are separated from each other and electrically insulated from each other.

The first wiring portion 81 extends from the first busbar 61 to a side opposite to the plurality of first electrode fingers 63 side. The first wiring portion 81 may partially overlap the first busbar 61 in the thickness direction D1 of the piezoelectric substrate 2, or may be integrally provided with the first busbar 61 with the same material and the same or substantially the same thickness as the first busbar 61. In addition, the first wiring portion 81 may have a stacked structure including a first lower layer integrally provided with the first busbar 61 and a first upper layer provided on the first lower layer.

The second wiring portion 82 extends from the second busbar 62 to a side opposite to the plurality of second electrode fingers 64 side. The second wiring portion 82 may partially overlap the second busbar 62 in the thickness direction D1 of the piezoelectric substrate 2, or may be integrally provided with the second busbar 62 with the same material and the same or substantially the same thickness as the second busbar 62. Further, the second wiring portion 82 may have a stacked structure including a second lower layer integrally provided with the second busbar 62 and a second upper layer provided on the second lower layer.

A material of the first upper layer of the first wiring portion 81 and the second upper layer of the second wiring portion is, for example, aluminum (Al), copper (Cu), platinum (Pt), gold (Au), titanium (Ti), chromium (Cr), or an alloy including any of these metals as a main component. The material of the first upper layer of the first wiring portion 81 and the second upper layer of the second wiring portion 82 may be, for example, NiCr.

The acoustic wave device 1 may further include a first terminal connected to the first busbar 61 via the first wiring portion 81 and a second terminal connected to the second busbar 62 via the second wiring portion 82. In addition, the acoustic wave device 1 may further include two third wiring portions respectively connected to each of the two reflectors 7. In this case, each of the two reflectors 7 may be connected to a third terminal via at least the third wiring portion. In the acoustic wave device 1, the plurality of external connection terminals including the first terminal, the second terminal, and the third terminal are electrodes for electrically connecting to a circuit substrate, a mounting substrate for a package (submount substrate), or the like. In addition, the acoustic wave device 1 may further include a plurality of dummy terminals that are not electrically connected to the IDT electrode 6. The plurality of dummy terminals are provided to increase the parallelism of the acoustic wave device 1 with respect to a circuit substrate, a mounting substrate, or the like, and are different from a terminal to provide electrical connection. That is, the dummy terminal prevents the acoustic wave device 1 from being mounted on a circuit substrate, a mounting substrate, or the like in an inclined manner, and is not necessarily provided depending on the number and configuration of the external connection terminals, the outer peripheral shape of the acoustic wave device 1, and the like.

The first terminal is integrally provided with the first wiring portion 81 with the same material and the same or substantially the same thickness as those of the first wiring portion 81, for example. The second terminal is integrally provided with the second wiring portion 82 with the same material and the same or substantially the same thickness as those of the second wiring portion 82, for example. The third terminal is integrally provided with the third wiring portion with the same material and the same or substantially the same thickness as those of the third wiring portion, for example. The third wiring portion is made of the same material and with the same or substantially the same thickness as the first wiring portion 81 and the second wiring portion 82, for example.

(2.5) Protective Film

The protective film 9 covers the IDT electrode 6, the first wiring portion 81, the second wiring portion 82, and the third wiring portion and each of the reflectors 7 on the first main surface 21 of the piezoelectric substrate 2, and a portion of the first main surface 21 of the piezoelectric substrate 2.

A material of the protective film 9 is, for example, silicon oxide, but is not limited thereto, and may be, for example, silicon nitride. The protective film 9 is not limited to a single layer structure, and may be a multilayer structure including two or more layers, for example.

In the acoustic wave device 1 according to Preferred Embodiment 1, the thickness of the protective film 9 is smaller than the thickness of the IDT electrode 6, and the surface of the protective film 9 has an uneven shape along the shape of the base of the protective film 9. In the acoustic wave device 1, the surface of the protective film 9 may be flattened into a planar shape. In addition, in the acoustic wave device 1, the thickness of the protective film 9 may be larger than the thickness of the IDT electrode 6, and the surface of the protective film 9 may have an uneven shape along the shape of the base of the protective film 9.

(3) Structure of Electrode

Figure 3:
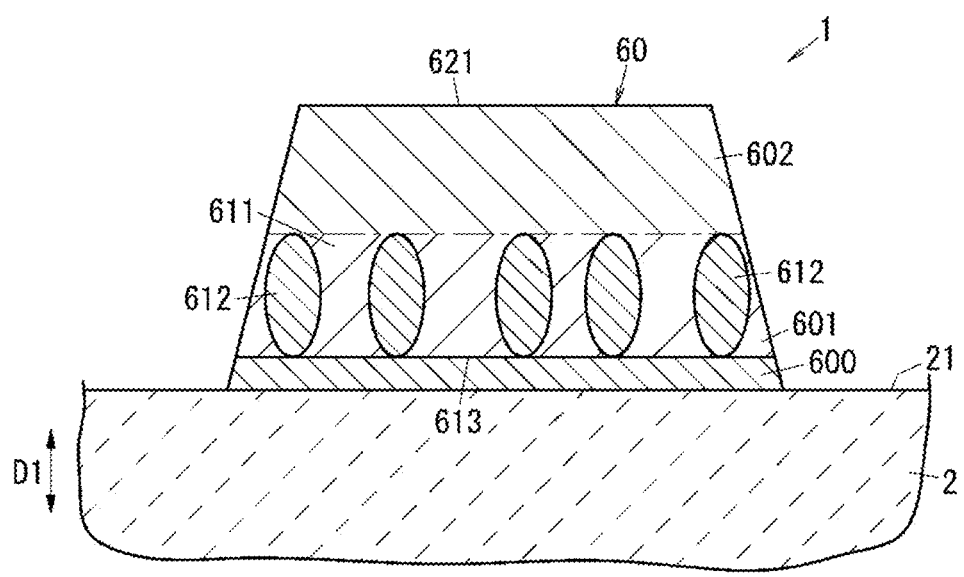
FIG. 3 is a vertical sectional view of an electrode of the acoustic wave device in FIG. 1.
Figure 4:
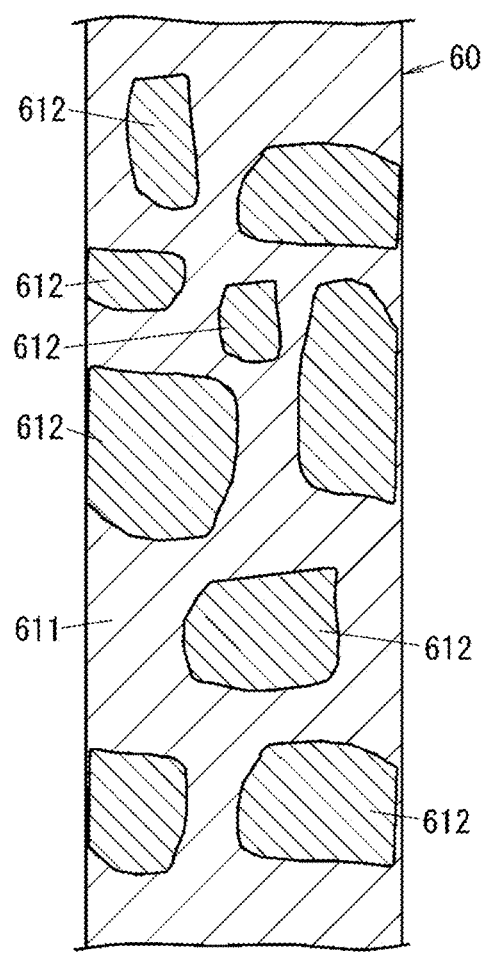
FIG. 4 is a sectional view of an electrode of the acoustic wave device in FIG. 1.

Each of the two electrodes 60 includes a first layer 601 and a second layer 602, as illustrated in FIGS. 3 and 4. The first layer 601 is closer to the piezoelectric substrate 2 side than the second layer 602, and includes, for example, Al (aluminum) and Cu (copper). The second layer 602 is on a side of the first layer 601 opposite to the piezoelectric substrate 2 side and includes, for example, Al. The second layer 602 includes a main surface 621 on the side opposite to the first layer 601 side. Preferably, each of the two electrodes 60 further includes an adhesive layer 600 interposed between the piezoelectric substrate 2 and the first layer 601. A material of the adhesive layer 600 is, for example, Ti (titanium), but is not limited thereto, and may be, for example, Cr or NiCr. In each of the two electrodes 60, the thicknesses of the adhesive layer 600, the first layer 601, and the second layer 602 are, for example, about 12 nm, about 78 nm, and about 78 nm, respectively. The thicknesses of the adhesive layer 600, the first layer 601, and the second layer 602 are examples, and are not limited to these numerical values.

The first layer 601 includes an Al crystal 611 and $CuAl_2$ crystal grains 612 provided in a direction orthogonal or substantially orthogonal to the thickness direction D1 of the piezoelectric substrate 2. Here, "the Al crystal 611 and the $CuAl_2$ crystal grains 612 are provided in the direction orthogonal or substantially orthogonal to the thickness direction D1" includes at least one of a first case and a second case. The first case refers to a case where, when the cross section of the electrode 60 along the second direction D2, which is the acoustic wave propagation direction, is viewed from the third direction D3, there is a portion where at least a portion of the Al crystal 611 and at least one $CuAl_2$ crystal grain 612 are provided not along the thickness direction D1 but along the second direction D2 orthogonal or substantially orthogonal to the thickness direction D1 in the first layer 601. The second case refers to a case where, when the cross section of the electrode 60 along the third direction D3 is viewed from the second direction D2, there is a portion where at least a portion of the Al crystal 611 and at least one $CuAl_2$ crystal grain 612 are provided not along the thickness direction D1 but along the third direction D3 orthogonal or substantially orthogonal to the thickness direction D1 in the first layer 601. At this time, at least a portion of the Al crystal 611 and the $CuAl_2$ crystal grains 612 are not necessarily provided on a straight line. In addition, the $CuAl_2$ crystal grains 612 are a metallic compound of Cu and Al and, for example, have a Cu concentration of about 54±10 wt %. In a plan view from the thickness direction D1 of the piezoelectric substrate 2, the Al crystal 611 includes a portion sandwiched between two $CuAl_2$ crystal grains 612. The first layer 601 includes the $CuAl_2$ crystal grains 612 sandwiched between respective portions of the Al crystal 611. The first layer 601 includes at least $CuAl_2$ crystal grains 612 as an aluminum-copper alloy, and may include CuAl crystal grains in addition to the $CuAl_2$ crystal grains 612. The Al crystal 611 may be, for example, an Al single crystal or an Al polycrystal including a plurality of Al crystal grains. Each of the plurality of Al crystal grains has a columnar shape extending in a direction along the thickness direction D1 of the piezoelectric substrate 2. The direction along the thickness direction D1 of the piezoelectric substrate 2 is a direction orthogonal or substantially orthogonal to the first main surface 21 of the piezoelectric substrate 2. In a plan view from the thickness direction D1 of the piezoelectric substrate 2, the grain size of the $CuAl_2$ crystal grains 612 is smaller than the width of the electrode 60 in the second direction D2. The "$CuAl_2$ crystal grains" referred to in the present preferred embodiment and the like are not limited to substances having a perfect crystal structure. The "$CuAl_2$ crystal grains" may be any material as long as a material that is not an amorphous body, in other words, a material in which even a small amount of crystal orientation is observed.

In each of the two electrodes 60, the $CuAl_2$ crystal grains 612 do not extend to the main surface 621 of the second layer 602. This point can be confirmed by, for example, a scanning transmission electron microscope (STEM) image obtained by observing the electrode 60 of the sample of the acoustic wave device 1 with the STEM.

In each of the two electrodes 60, the Cu concentration of the first layer 601 is preferably, for example, equal to or more than about 15 wt % from the viewpoint of improving the power durability of the acoustic wave device 1. In addition, in each of the two electrodes 60, the Cu concentration of the first layer 601 is preferably, for example, equal to or lower than about 30 wt % from the viewpoint of suppressing a decrease in the characteristics of the acoustic wave device 1 due to an increase in the electric resistance of the electrode 60. The relationship between the Cu concentration of the first layer 601 and the resistivity and power durability will be described later in "(5) Operation and Characteristics of Acoustic Wave Device". In each of the two electrodes 60, the Cu concentration of the second layer 602 is preferably, for example, equal to or more than about 0.1 wt % from the viewpoint of reducing or preventing the characteristic deterioration due to stress migration. However, in each of the two electrodes 60, the Cu concentration of the second layer 602 may be about 0 wt % and the Al concentration may be about 100 wt %, for example. In each of the two electrodes 60, the Cu concentration of the second layer 602 is preferably, for example, equal to or less than about 10 wt % from the viewpoint of reducing or preventing a decrease in the characteristics of the acoustic wave device 1 due to an increase in the electric resistance of the electrode 60.

Figure 5:
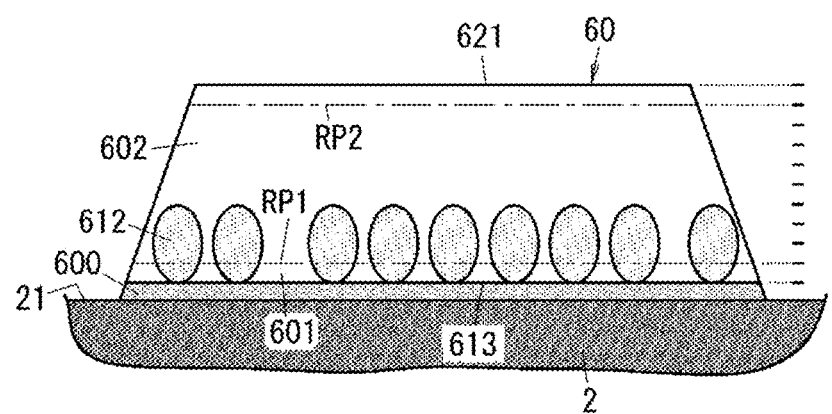
FIG. 5 is a schematic view of a scanning transmission electron microscope (STEM) image of the acoustic wave device in FIG. 1.

In the acoustic wave device 1 according to an example, the Cu concentration of the first layer 601 is about 20 wt %, and the Cu concentration of the second layer 602 is about 1 wt %. FIG. 5 is a schematic diagram of a STEM image of the electrode 60 of the acoustic wave device 1 according to the example.

The Cu concentration of the first layer 601 and the Cu concentration of the second layer 602 can be obtained, for example, by observing the electrode 60 of the sample of the acoustic wave device 1 with a STEM. The Cu concentration of the first layer 601 is an average value of values obtained by analyzing a first specific region of the first layer 601 by energy dispersive X-ray spectroscopy (EDX) in a STEM image. The Cu concentration of the second layer 602 is an average value of values obtained by analyzing a second specific region of the second layer 602 by the EDX in the STEM image. The first specific region is a region between a lower surface 613 of the first layer 601 and a first reference plane RP1. The first reference plane RP1 is a plane that is above the lower surface 613 of the first layer 601 by about 10% of the total of the thicknesses of the first layer 601 and the second layer 602. In FIG. 5, a scale obtained by dividing the total of the thicknesses of the first layer 601 and the second layer 602 into ten equal or substantially equal portions is illustrated on the right side of the electrode 60. The second specific region is a region between the main surface 621 of the second layer 602 and a second reference plane RP2. The second reference plane RP2 is a plane that is below the main surface 621 of the second layer 602 by about 10% of the total of the thicknesses of the first layer 601 and the second layer 602.

Note that the fact that the electrode 60 includes the first layer 601 can be confirmed by the configuration that, when the electrode 60 is viewed in a section orthogonal or substantially orthogonal to the second direction D2 or the third direction D3, there is a portion where the Al crystal 611 and the $CuAl_2$ crystal grains 612 are provided in a direction orthogonal or substantially orthogonal to the thickness direction D1. In addition, the fact that the electrode 60 includes the second layer 602 can be confirmed by the configuration that, when the electrode 60 is viewed in a section orthogonal or substantially orthogonal to the second direction D2 or the third direction D3, there is no portion where the Al crystal 611 and the $CuAl_2$ crystal grains 612 are provided in a direction orthogonal or substantially orthogonal to the thickness direction D1 or only the Al crystal 611 is present in a direction orthogonal or substantially orthogonal to the thickness direction D1 in the second specific region described above.

(4) Method of Manufacturing Acoustic Wave Device

Hereinafter, a non-limiting example of a method of manufacturing the acoustic wave device 1 will be described with reference to FIGS. 6A to 6F.

In the non-limiting example of a method of manufacturing the acoustic wave device 1, the first step to the seventh step are performed.

Figure 6A:
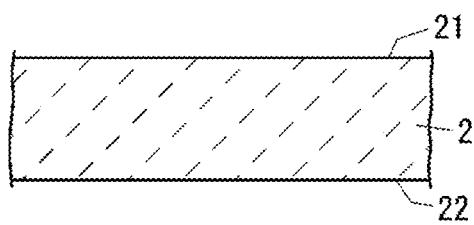
FIGS. 6A to 6F are sectional views illustrating a non-limiting example of a method of manufacturing the acoustic wave device in FIG. 1.

In the first step, the piezoelectric substrate 2 including the first main surface 21 and the second main surface 22 facing each other is prepared (see FIG. 6A).

Figure 6D:
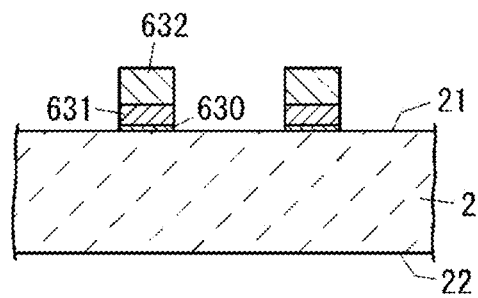
Figure 6B:
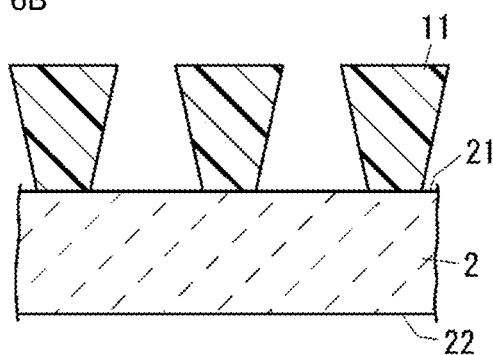

In the second step, the resist layer 11 is formed on the first main surface 21 of the piezoelectric substrate 2, as illustrated in FIG. 6B. Here, in the second step, the resist layer 11 patterned so as to expose regions, where the electrodes 60 are to be formed, of the first main surface 21 of the piezoelectric substrate 2 is formed. Here, the resist layer 11 is patterned so as to expose the regions where each of the reflectors 7 is to be formed in addition to the regions where each of the electrodes 60 is to be formed.

Figure 6E:
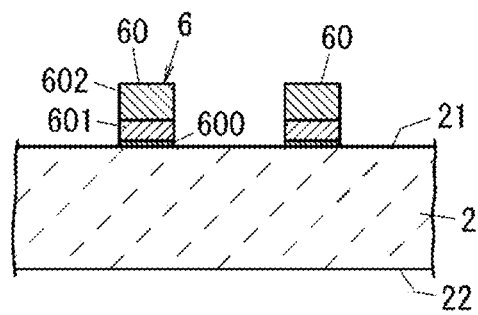
Figure 6C:
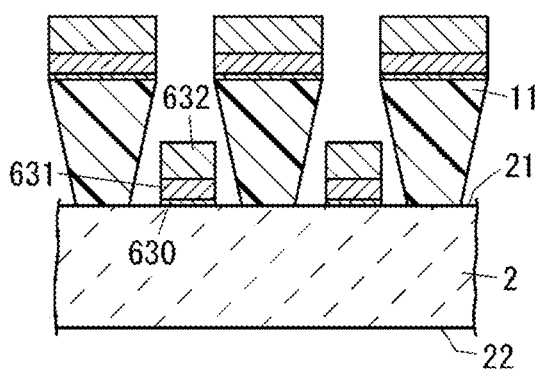

In the third step, as illustrated in FIG. 6C, a laminated film of an adhesive film 630 defining and functioning as a base of the adhesive layer 600, a first AlCu film 631 defining and functioning as a base of the first layer 601, and a second AlCu film 632 defining and functioning as a base of the second layer 602 is formed by, for example, a vapor deposition method. The material of the adhesive film 630 is, for example, Ti. The thickness of the adhesive film 630 is, for example, about 12 nm. The Cu concentration of the first AlCu film 631 is, for example, equal to or more than about 15 wt % and equal to or less than about 30 wt %. A thickness T1 of the first AlCu film 631 (FIG. 7) is, for example, about 78 nm. The Cu concentration of the second AlCu film 632 is, for example, equal to or more than about 0.5 wt % and equal to or less than about 1 wt %. A thickness T2 of the second AlCu film 632 (see FIG. 7) is, for example, about 78 nm. The thickness T1 of the first AlCu film 631 and the thickness T2 of the second AlCu film 632 are set such that the weight of the first layer 601 and the weight of the second layer 602 are equal or substantially equal to each other, but are not particularly limited. The ratio between the thickness T1 of the first AlCu film 631 and the thickness T2 of the second AlCu film 632 may be changed as appropriate within a range in which any one of the thickness T1 and the thickness T2 is not 100% of T1+T2.

In the fourth step, lift-off is performed to remove the resist layer 11 and an unnecessary film on the resist layer 11, thus patterning the laminated film (see FIG. 6D). Thus, in the fourth step, portions of the laminated film corresponding to the electrodes 60 remain on the first main surface 21 of the piezoelectric substrate 2. In addition, in the fourth step, portions of the laminated film corresponding to the reflectors 7 also remain. Here, the unnecessary film is a portion of the laminated film formed in the third step that has been formed on the resist layer 11.

In the fifth step, heat treatment is performed to form the first layer 601, the second layer 602, and the like of each electrode 60 (see FIG. 6E). In short, in the fifth step, the electrodes 60 and the like are formed by performing the above-described heat treatment. The heat treatment is performed, for example, in a $N_2$ gas atmosphere. The conditions of the heat treatment are, for example, a heat treatment temperature of about 270° C. and a heat treatment time of 4 about hours, but are not limited to these values. The heat treatment temperature and the heat treatment time may be appropriately set that the first layer 601 including the Al crystal 611 and the $CuAl_2$ crystal grains 612 is formed by the heat treatment in the fifth step.

In the sixth step, the first wiring portion 81, the second wiring portion 82, the third wiring portion, the first terminal, the second terminal, and the third terminal are formed. The first wiring portion 81, the second wiring portion 82, the third wiring portion, the first terminal, the second terminal, and the third terminal are formed by using, for example, a thin film forming technique, a photolithography technique, and an etching technique, but are not limited thereto, and may be formed by using, for example, a lift-off method. Further, in the third step described above, the first wiring portion 81, the second wiring portion 82, the third wiring portion, the first terminal, the second terminal, and the third terminal may be formed. Further, in the third step described above, a lower layer portion of each of the first wiring portion 81, the second wiring portion 82, the third wiring portion, the first terminal, the second terminal, and the third terminal may be formed, and in the sixth step, an upper layer portion of each of the first wiring portion 81, the second wiring portion 82, the third wiring portion, the first terminal, the second terminal, and the third terminal may be formed.

Figure 6F:
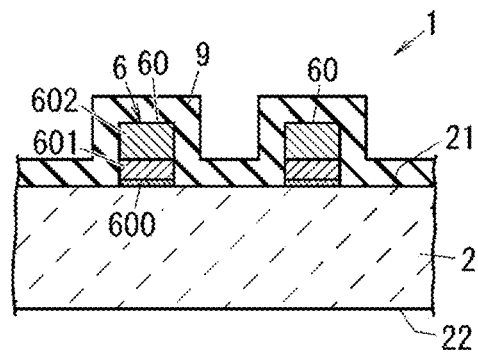
Figure 7:
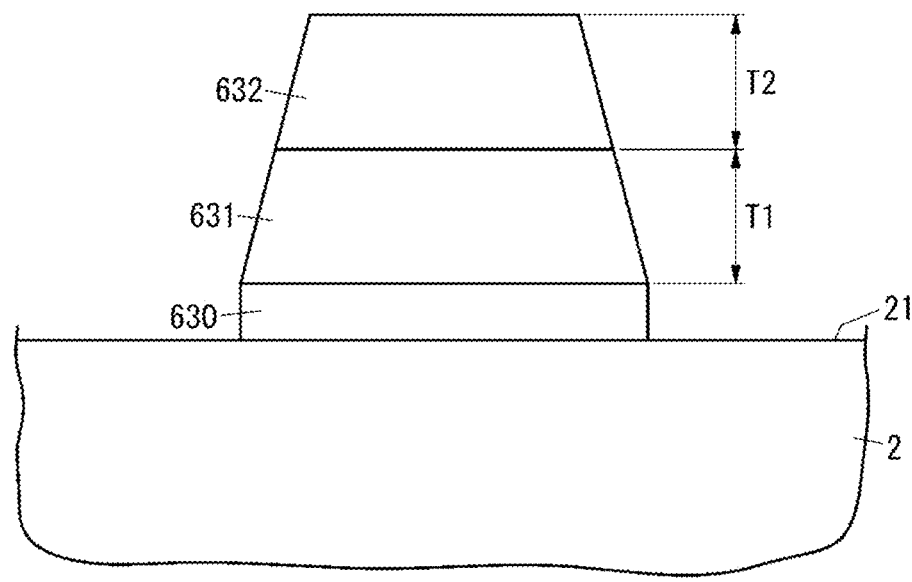
FIG. 7 is an explanatory diagram of a non-limiting example of a method of manufacturing the acoustic wave device in FIG. 1.

In the seventh step, as illustrated in FIG. 6F, the protective film 9 is formed to cover the IDT electrode 6, the first wiring portion 81, the second wiring portion 82, the third wiring portion, and each reflector 7 on the first main surface 21 of the piezoelectric substrate 2, and a part of the first main surface 21 of the piezoelectric substrate 2.

In the non-limiting example of a method of manufacturing the acoustic wave device 1, when the piezoelectric substrate 2 is prepared in the first step, a piezoelectric wafer capable of manufacturing the plurality of acoustic wave devices 1 is prepared as the piezoelectric substrate 2. In the method of manufacturing the acoustic wave device 1, after the seventh step, a wafer including the plurality of acoustic wave devices 1 is diced to obtain the plurality of acoustic wave devices 1 (chips). The method of manufacturing the acoustic wave device 1 is an example and is not particularly limited. The fifth step is simply required to be performed after the fourth step, and may be performed, for example, after the sixth step or after the seventh step. In addition, in the case where the acoustic wave device 1 includes the resin portion as a portion of the package, the fifth step may also provide heat treatment for thermally curing the resin layer defining and functioning as the base of the resin portion.

(5) Operation and Characteristics of Acoustic Wave Device

Figure 8:
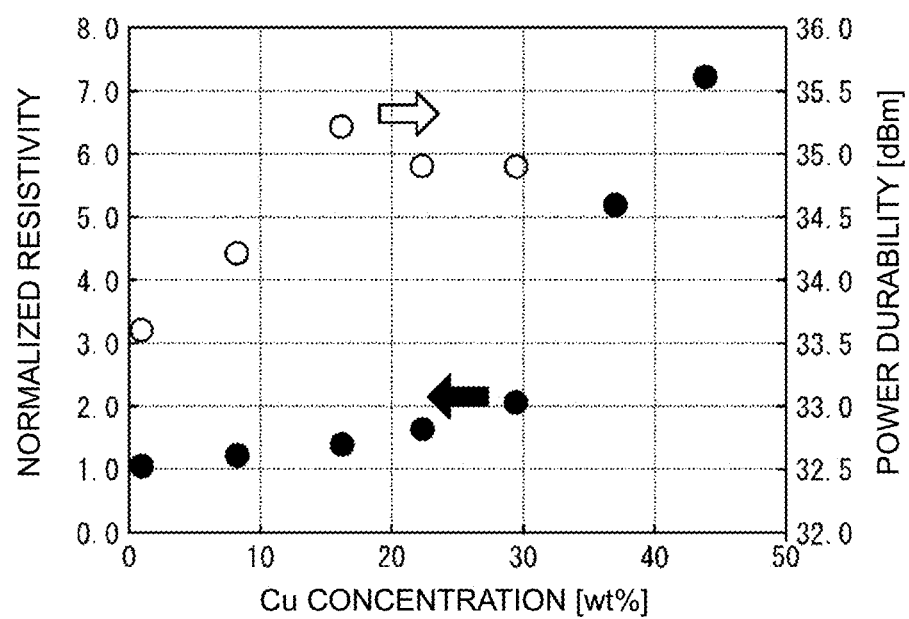
FIG. 8 is a graph showing the relationship between the Cu concentration, the normalized resistivity, and the power durability of the acoustic wave device in FIG. 1.

FIG. 8 shows the relationship between the Cu concentration, the normalized resistivity of the first layer 601, and the power durability of the acoustic wave device 1 when the Cu concentration of the first layer 601 is changed assuming that the Cu concentration of the second layer 602 as about 1 wt % in the acoustic wave device 1. In FIG. 8, the horizontal axis represents the Cu concentration of the first layer 601, the vertical axis on the left side represents the normalized resistivity of the first layer 601, and the vertical axis on the right side represents the power durability of the acoustic wave device 1. Here, the normalized resistivity is a resistivity normalized assuming that the resistivity of the first layer 601 having a Cu concentration of about 1 wt % is about 1.0. In FIG. 8, black circles represent normalized resistivity data, and white circles represent power durability data.

From FIG. 8, from the viewpoint of further improving the power durability of the acoustic wave device 1, the Cu concentration of the first layer 601 is preferably equal to or more than about 15 wt %, for example. Further, from FIG. 8, from the viewpoint of reducing or preventing an increase in electric resistance of the electrode 60, the Cu concentration of the first layer 601 is preferably equal to or less than about 30 wt %, for example.

(6) Summary

The acoustic wave device 1 according to Preferred Embodiment 1 includes the piezoelectric substrate 2 and the electrode 60. The electrode 60 is provided on the piezoelectric substrate 2. The electrode 60 includes the first layer 601 and the second layer 602. The first layer 601 includes Al and Cu. The second layer 602 is provided on a side of the first layer 601 opposite to the piezoelectric substrate 2 side and includes Al. The first layer 601 includes an Al crystal 611 and at least a portion of $CuAl_2$ crystal grains 612 that are provided in a direction orthogonal or substantially orthogonal to the thickness direction D1 of the piezoelectric substrate 2. In the electrode 60, the $CuAl_2$ crystal grains 612 do not extend the main surface 621 of the second layer 602 on the side opposite to the first layer 601 side.

In the acoustic wave device 1 according to Preferred Embodiment 1, it is possible to improve power durability while reducing or preventing a decrease in characteristics.

In the acoustic wave device 1 according to Preferred Embodiment 1, the first layer 601, to which larger stress is applied when electric power is applied, of the first layer 601 and the second layer 602 includes the $CuAl_2$ crystal grains 612 having high tensile strength. Therefore, the electric power durability can be improved. Further, in the acoustic wave device 1 according to Preferred Embodiment 1, the $CuAl_2$ crystal grains 612 do not extend to the main surface 621 of the second layer 602 on the side opposite to the first layer 601 side. Therefore, even when the power durability of the electrode 60 is improved by increasing the Cu concentration of the $CuAl_2$ crystal grains, an increase in the electric resistance of the second layer 602 can be reduce or prevented, and a decrease in the characteristics of the acoustic wave device 1 can be reduced or prevented.

Modification of Preferred Embodiment 1

Figure 9:
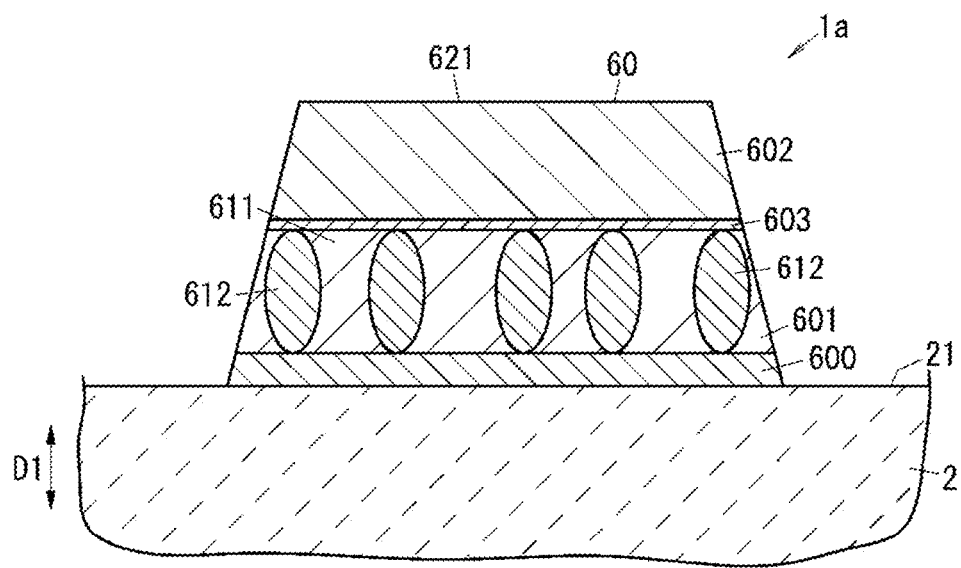
FIG. 9 is a vertical sectional view of an electrode of an acoustic wave device according to a modification of Preferred Embodiment 1 of the present invention.

An acoustic wave device 1a according to a modification of Preferred Embodiment 1 of the present invention will be described with reference to FIG. 9. In the acoustic wave device 1a according to Modification 1 of Preferred Embodiment 1, the same or corresponding components as those of the acoustic wave device according to Preferred Embodiment 1 are denoted by the same reference numerals, and a description thereof will be omitted.

The acoustic wave device 1a according to the present modification differs from the acoustic wave device 1 according to Preferred Embodiment 1 in that each of the plurality of electrodes 60 further includes an intermediate layer 603 located between the first layer 601 and the second layer 602. The intermediate layer 603 is interposed between the first layer 601 and the second layer 602, and defines and functions as a barrier layer that reduces or prevents diffusion between the first layer 601 and the second layer 602.

The intermediate layer 603 has electrical conductivity. The material of the intermediate layer 603 is, for example, Ti, but is not limited thereto, and may be, for example, any one of Cr, NiCr, Mo, and AlTi. The thickness of the intermediate layer 603 is, for example, about 5 nm. The thickness of the intermediate layer 603 is preferably not thicker than about 30 nm from the viewpoint of reducing or preventing an increase in the electric resistance of the electrode 60. In addition, the intermediate layer 603 is preferably thicker than about 4 nm from the viewpoint of uniform and reproducible thicknesses.

A non-limiting example of a method of manufacturing the acoustic wave device 1a according to the modification of Preferred Embodiment 1 is the same or substantially the same as the method of manufacturing the acoustic wave device 1 according to Preferred Embodiment 1, except that a laminated film including an adhesive film defining and functioning as a base of the adhesive layer 600, a first AlCu film defining and functioning as a base of the first layer 601, a barrier film defining and functioning as a base of the intermediate layer 603, and a second AlCu film defining and functioning as a base of the second layer 602 is formed by, for example, a vapor deposition method in the third step. This makes it possible to prevent the $CuAl_2$ crystal grains 612 of the first layer 601 formed when the heat treatment is performed in the fifth step from reaching the second layer 602. That is, since the precipitated $CuAl_2$ crystal grains are stopped by the intermediate layer 603 when the heat treatment in the fifth step is performed, the precipitation of the $CuAl_2$ crystal grains 612 on the second layer 602 can be reduced or prevented by the intermediate layer 603.

In the acoustic wave device 1a according to the present modification, each of the plurality of electrodes 60 further includes the intermediate layer 603 located between the first layer 601 and the second layer 602, therefore, power durability can be improved. In addition, since the acoustic wave device 1a according to the present modification includes the intermediate layer 603, it is possible to reduce or prevent variation in the size of the $CuAl_2$ crystal grains 612 in the thickness direction D1 of the piezoelectric substrate 2 and to reduce or prevent variation in characteristics.

Preferred Embodiment 2

Figure 10:
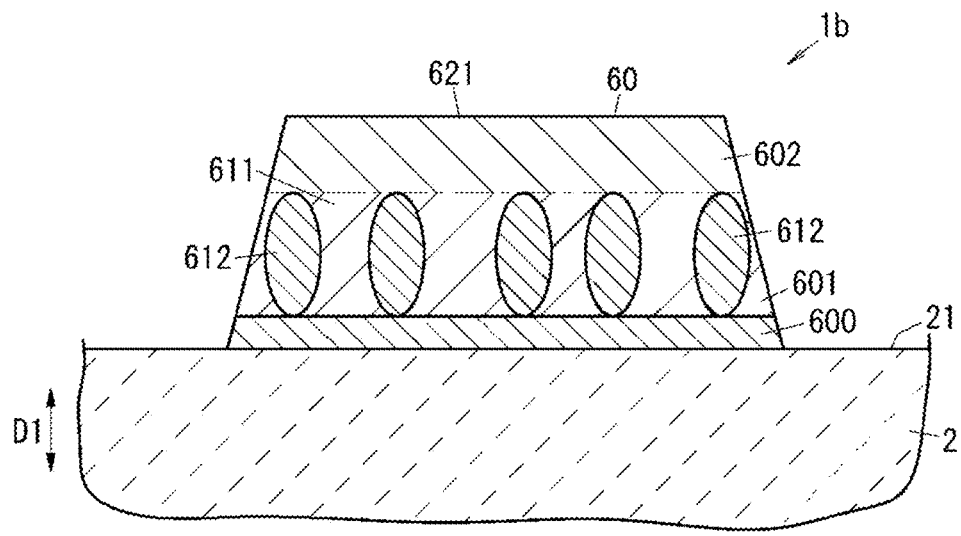
FIG. 10 is a vertical sectional view of an acoustic wave device according to Preferred Embodiment 2 of the present invention.

An acoustic wave device 1b according to Preferred Embodiment 2 of the present invention will be described with reference to FIG. 10. In the acoustic wave device 1b according to Preferred Embodiment 2, the same or corresponding components as those of the acoustic wave device 1 according to Preferred Embodiment 1 are denoted by the same reference numerals, and a description thereof will be omitted.

In the acoustic wave device 1b according to Preferred Embodiment 2, the second layer 602 of the electrode 60 includes, for example, Cu. The Cu concentration of the second layer 602 is, for example, about 100 wt %. The Al concentration of the second layer 602 is equal to or lower than the detection limit by EDX. The second layer 602 may include, for example, Al in addition to Cu. Also in this case, the Cu concentration is preferably equal to or more than about 95 wt %.

Figure 11:
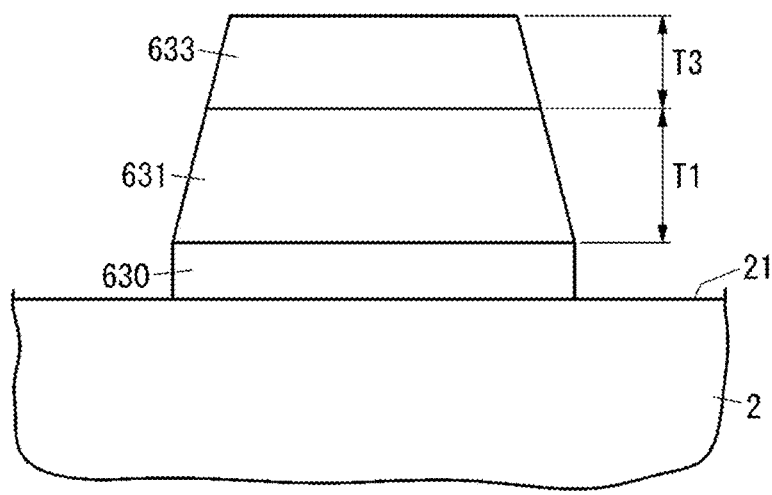
FIG. 11 is an explanatory diagram of a non-limiting example of a method of manufacturing the acoustic wave device in FIG. 10.

A non-limiting example of a method of manufacturing the acoustic wave device 1b according to Preferred Embodiment 2 is the same or substantially the same as the above-described method of manufacturing the acoustic wave device 1 according to Preferred Embodiment 1, except that a laminated film as illustrated in FIG. 11 is formed on the first main surface 21 of the piezoelectric substrate 2 by, for example, vapor deposition in the third step. Here, the laminated film is an adhesive film 630 defining and functioning as a base of the adhesive layer 600, the first AlCu film 631 defining and functioning as a base of the first layer 601, and the Cu film 633 defining and functioning as a base of the second layer 602. Thicknesses of the adhesive film 630, the first AlCu film 631, and the Cu film 633 are, for example, about 12 nm, about 78 nm, and about 24 nm, respectively. The thickness T1 of the first AlCu film 631 and a thickness T3 of the Cu film 633 are set such that the weight of the first layer 601 and the weight of the second layer 602 are equal or substantially equal to each other, but are not particularly limited. The ratio of the thickness T1 of the first AlCu film 631 and the thickness T3 of the Cu film 633 may be appropriately changed within a range in which any one of the thickness T1 and the thickness T3 is not 100% of T1+T3. The non-limiting example of a method of manufacturing the acoustic wave device 1b according to Preferred Embodiment 2 is the same or substantially the same as the above-described method of manufacturing the acoustic wave device 1 according to Preferred Embodiment 1, except for the third step.

The acoustic wave device 1b according to Preferred Embodiment 2 includes the piezoelectric substrate 2 and the electrode 60. The electrode 60 is formed on the piezoelectric substrate 2. The electrode 60 includes the first layer 601 and the second layer 602. The first layer 601 is formed on the piezoelectric substrate 2 side and includes Al and Cu. The second layer 602 is formed on a side of the first layer 601 opposite to the piezoelectric substrate 2 side and includes Cu. The first layer 601 includes the Al crystal 611 and the $CuAl_2$ crystal grains 612 that are provided in a direction orthogonal to the thickness direction D1 of the piezoelectric substrate 2. In the electrode 60, the $CuAl_2$ crystal grains 612 do not extend to the main surface 621 of the second layer 602 on the side opposite to the first layer 601 side.

In the acoustic wave device 1b according to Preferred Embodiment 2, it is possible to improve power durability while reducing or preventing a decrease in characteristics.

Preferred Embodiment 3

Figure 12:
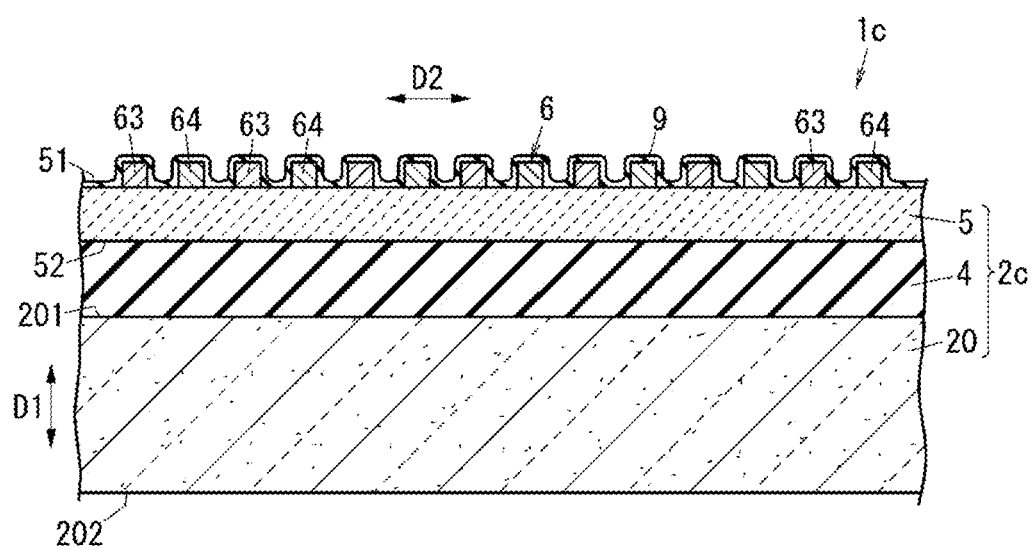
FIG. 12 is a sectional view of an acoustic wave device according to Preferred Embodiment 3 of the present invention.

Hereinafter, an acoustic wave device 1c according to Preferred Embodiment 3 of the present invention will be described with reference to FIG. 12.

The acoustic wave device 1c according to Preferred Embodiment 3 is different from the acoustic wave device 1 according to Preferred Embodiment 1 in that a piezoelectric substrate 2c is provided instead of the piezoelectric substrate 2 of the acoustic wave device 1 according to Preferred Embodiment 1. In the acoustic wave device 1c according to Preferred Embodiment 3, the same or corresponding components as those of the acoustic wave device 1 according to Preferred Embodiment 1 are denoted by the same reference numerals, and a description thereof will be omitted.

The piezoelectric substrate 2c of the acoustic wave device 1c is not a piezoelectric substrate such as the piezoelectric substrate 2 of the acoustic wave device 1 according to Preferred Embodiment 1, but instead, a laminated substrate. To be more specific, the piezoelectric substrate 2c is a laminated substrate including a support substrate 20, a low acoustic velocity film 4, and a piezoelectric layer 5.

The low acoustic velocity film 4 is provided on the support substrate 20. Here, "provided on the support substrate 20" includes a case of being provided directly on the support substrate 20 and a case of being provided indirectly on the support substrate 20. The piezoelectric layer 5 is provided on the low acoustic velocity film 4. Here, "provided on the low acoustic velocity film 4" includes a case of being provided directly on the low acoustic velocity film 4 and a case of being provided indirectly on the low acoustic velocity film 4. Each electrode 60 of the IDT electrode 6 is formed on the piezoelectric layer 5.

Hereinafter, the piezoelectric substrate 2c will be described in more detail.

The support substrate 20 includes a first main surface 201 and a second main surface 202 that face each other. The first main surface 201 and the second main surface 202 face each other in the thickness direction D1 of the piezoelectric substrate 2c. In a plan view from the thickness direction D1 of the piezoelectric substrate 2c, the support substrate 20 has, for example, a rectangular or substantially rectangular shape, but may have, for example, a square or substantially square shape.

In the support substrate 20, the acoustic velocity of a bulk wave propagating through the support substrate 20 is higher than the acoustic velocity of an acoustic wave propagating through the piezoelectric layer 5. Here, the bulk wave propagating through the support substrate 20 is a bulk wave having the lowest acoustic velocity among a plurality of bulk waves propagating through the support substrate 20.

The support substrate 20 is, for example, a silicon substrate. The thickness of the support substrate 20 is, for example, preferably equal to or more than about 10λ (λ: wavelength of acoustic wave determined by the electrode finger pitch P1) and equal to or less than about 180 μm, and is about 120 μm, for example. In a case where the support substrate 20 is a silicon substrate, the plane orientation of the first main surface 201 of the support substrate 20 is, for example, a (100) plane, but is not limited thereto, and may be, for example, a (110) plane, a (111) plane, or the like. The propagation direction of the acoustic wave can be set without being restricted by the plane orientation of the first main surface 201 of the support substrate 20.

The support substrate 20 is not limited to a silicon substrate. The support substrate 20 is simply required to include, for example, at least one kind of material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The piezoelectric layer 5 includes a first main surface 51 and a second main surface 52 that face each other. The first main surface 51 and the second main surface 52 face each other in the thickness direction D1 of the piezoelectric substrate 2c.

The piezoelectric layer 5 is made of, for example, Γ° Y-cut X-propagation LiTaO$_3$ piezoelectric single crystal. When three crystal axes of a LiTaO$_3$ piezoelectric single crystal are defined as an X-axis, a Y-axis, and a Z-axis, the Γ° Y-cut X-propagation LiTaO$_3$ piezoelectric single crystal is a LiTaO$_3$ single crystal in which a surface acoustic wave propagates in the X-axis direction, and obtained by cutting the LiTaO$_3$ piezoelectric single crystal along a plane having, as a normal line, an axis that is rotated about the X-axis as the center axis by Γ° from the Y-axis in a Z-axis direction. The cut angle of the piezoelectric layer 5 is Γ=θ+90° where Γ [°] is the cut angle and (φ, θ, ψ) is the Euler angles of the piezoelectric layer 5. Here, Γ and Γ±180×n are synonymous (crystallographically equivalent). Here, n is a natural number. The piezoelectric layer 5 is not limited to a Γ° Y-cut X-propagation LiTaO$_3$ piezoelectric single crystal, and may be, for example, a Γ° Y-cut X-propagation LiTaO$_3$ piezoelectric ceramic.

The thickness of the piezoelectric layer 5 is, for example, equal to or less than about 3.5λ when the wavelength of the acoustic wave determined by the electrode finger pitch P1 (see FIG. 1) of the IDT electrodes 6 is λ. When the thickness of the piezoelectric layer 5 is equal to or less than about 3.5λ, the Q value increases. In addition, by setting the thickness of the piezoelectric layer 5 to equal to or less than about 2.5λ, a temperature coefficient of frequency (TCF) can be reduced. Further, by setting the thickness of the piezoelectric layer 5 to equal to or less than about 1.5λ, it becomes easy to adjust the acoustic velocity of the acoustic wave. Note that the thickness of the piezoelectric layer 5 is not limited to equal to or less than about 3.5λ, and may be greater than about 3.5λ.

Meanwhile, when the thickness of the piezoelectric layer 5 is equal to or less than about 3.5λ, the Q value increases as described above, but a higher-order mode occurs. In the acoustic wave device 1c, the above-described low acoustic velocity film 4 is provided so as to reduce or prevent the higher-order mode even when the thickness of the piezoelectric layer 5 is equal to or less than about 3.5λ.

In the acoustic wave device 1c, as a mode of an acoustic wave propagating through the piezoelectric layer 5, there is, for example, a longitudinal wave, an SH wave, or an SV wave, or a mode in which these waves are combined. In the acoustic wave device 1c, a mode having an SH wave as a main component is used as a main mode. The higher-order mode is a spurious mode generated on a higher frequency side than a main mode of an acoustic wave propagating through the piezoelectric layer 5. Whether or not the mode of the acoustic wave propagating through the piezoelectric layer 5 is the "main mode having an SH wave as a main component" can be confirmed by analyzing the displacement distribution by the finite element method using parameters such as the parameters (material, Euler angles, thickness, etc.) of the piezoelectric layer 5, the parameters (material, thickness, electrode finger pitch, etc.) of the IDT electrode 6, and the parameters (material, thickness, etc.) of the low acoustic velocity film 4 and analyzing the strain. The Euler angles of the piezoelectric layer 5 can be obtained by analysis.

The material of the piezoelectric layer 5 is not limited to lithium tantalate (LiTaO$_3$), and may be, for example, lithium niobate (LiNbO$_3$), zinc oxides (ZnO), aluminum nitrides (AlN), or lead zirconate titanate (PZT). In a case where the piezoelectric layer 5 is made of, for example, a Y-cut X-propagation LiNbO$_3$ piezoelectric single crystal or piezoelectric ceramics, the acoustic wave device 1c can use a mode having an SH wave as a main component as a main mode by using a Love wave as an acoustic wave. The single crystal material and the cut angle of the piezoelectric layer 5 may be appropriately determined according to, for example, a required specification or the like of a filter (filter characteristics such as a bandpass characteristic, an attenuation characteristic, temperature characteristics, and a band width).

The low acoustic velocity film 4 is a film in which the acoustic velocity of the bulk wave propagating through the low acoustic velocity film 4 is lower than the acoustic velocity of the bulk wave propagating through the piezoelectric layer 5.

In the acoustic wave device 1c according to Preferred Embodiment 3, the low acoustic velocity film 4 is provided between the support substrate 20 and the piezoelectric layer 5. Since the low acoustic velocity film 4 is provided between the support substrate 20 and the piezoelectric layer 5, the acoustic velocity of the acoustic wave decreases. The acoustic wave essentially has the property that energy is concentrated in a medium with a low acoustic velocity. Therefore, it is possible to improve the advantageous effect of confining the energy of the acoustic wave in the piezoelectric layer 5 and the IDT electrode 6 in which the acoustic wave is excited. As a result, the loss can be reduced and the Q value can be increased as compared with the case where the low acoustic velocity film 4 is not provided.

The material of the low acoustic velocity film 4 is, for example, silicon oxide. The material of the low acoustic velocity film 4 is not limited to silicon oxide. The material of the low acoustic velocity film 4 may be, for example, silicon oxide, glass, silicon oxynitride, tantalum oxide, a compound obtained by adding fluorine, carbon, or boron to silicon oxide, or a material including each of these materials as a main component.

In a case where the low acoustic velocity film 4 is silicon oxide, the temperature characteristics can be improved. The elastic constant of lithium tantalate has a negative temperature characteristic, and silicon oxide has a positive temperature characteristic. Therefore, in the acoustic wave device 1c, the absolute value of the TCF can be reduced.

The thickness of the low acoustic velocity film 4 is preferably, for example, equal to or less than about 2.0λ, where λ is the wavelength of the acoustic wave determined by the electrode finger pitch P1 described above. The thickness of the low acoustic velocity film 4 is, for example, about 670 nm. By setting the thickness of the low acoustic velocity film 4 to equal to or less than about 2.0λ, the film stress can be reduced, as a result, it is possible to reduce warpage of a silicon wafer defining and functioning as a base of the support substrate 20 when the acoustic wave device 1c is manufactured, and it is possible to improve the yield rate and stabilize the characteristics.

In addition, in the acoustic wave device 1c, the piezoelectric substrate 2c may include, for example, an adhesive layer interposed between the low acoustic velocity film 4 and the piezoelectric layer 5. This makes it possible to improve close contact property between the low acoustic velocity film 4 and the piezoelectric layer 5. The adhesive layer is made of, for example, resin (epoxy resin, polyimide resin, and the like), metal, or the like. In addition, in the acoustic wave device 1c, the piezoelectric substrate 2c includes but is not limited to the adhesive layer, and may include a dielectric film between the low acoustic velocity film 4 and the piezoelectric layer 5, on the piezoelectric layer 5, or under the low acoustic velocity film 4.

Preferred Embodiment 4

Figure 13:
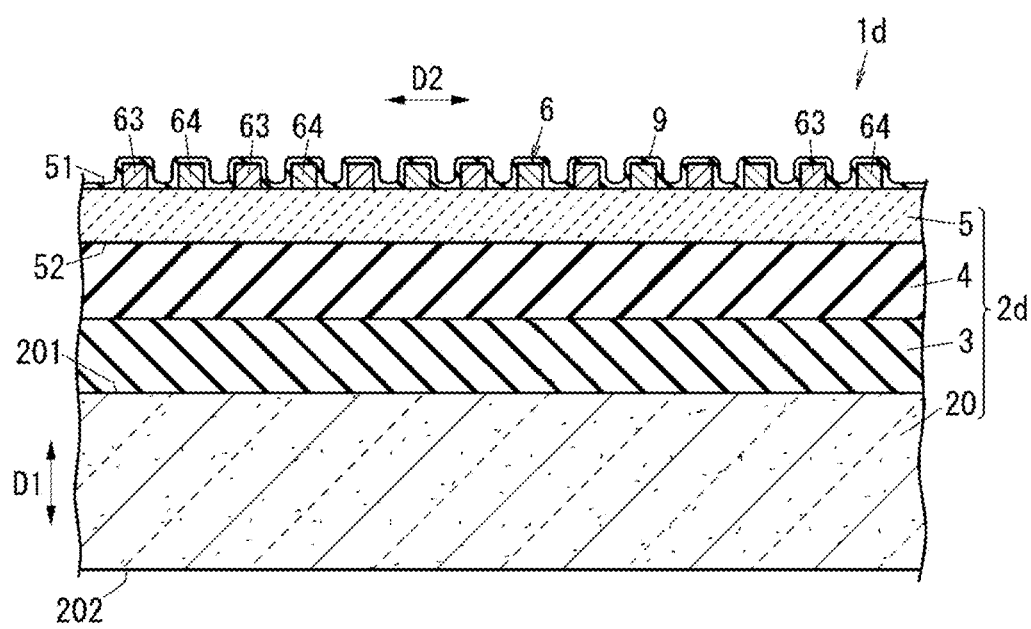
FIG. 13 is a sectional view of an acoustic wave device according to Preferred Embodiment 4 of the present invention.

An acoustic wave device 1d according to Preferred Embodiment 4 of the present invention will be described with reference to FIG. 13. In the acoustic wave device 1d according to Preferred Embodiment 4, the same or corresponding components as those of the acoustic wave device 1c according to Preferred Embodiment 3 are denoted by the same reference numerals, and a description thereof will be omitted.

An acoustic wave device 1d according to Preferred Embodiment 4 differs from the acoustic wave device 1c according to Preferred Embodiment 3 in that a piezoelectric substrate 2d is provided instead of the piezoelectric substrate 2c of the acoustic wave device 1c according to Preferred Embodiment 3.

The piezoelectric substrate 2d is different from the piezoelectric substrate 2c in that a high acoustic velocity film 3 is further provided.

The high acoustic velocity film 3 is provided between the support substrate 20 and the low acoustic velocity film 4. Here, the high acoustic velocity film 3 is provided on the support substrate 20. "Provided on the support substrate 20" includes a case of being provided directly on the support substrate 20 and a case of being provided indirectly on the support substrate 20. The low acoustic velocity film 4 is provided on the high acoustic velocity film 3. "Provided on the high acoustic velocity film 3" includes a case of being provided directly on the high acoustic velocity film 3 and a case of being provided indirectly on the high acoustic velocity film 3.

The high acoustic velocity film 3 is a film in which the acoustic velocity of a bulk wave propagating through the high acoustic velocity film 3 is higher than the acoustic velocity of an acoustic wave propagating through the piezoelectric layer 5. The thickness of the high acoustic velocity film 3 is, for example, about 200 nm, about 300 nm, and about 400 nm.

The high acoustic velocity film 3 reduces or prevents the energy of the acoustic wave in the main mode from leaking to a structure below the high acoustic velocity film 3. In the acoustic wave device 1d, in a case where the high acoustic velocity film 3 is sufficiently thick, the energy of the acoustic wave in the main mode is distributed to the entire or substantially the entire piezoelectric layer 5 and the low acoustic velocity film 4, and is distributed to a portion of the high acoustic velocity film 3 on the low acoustic velocity film 4 side, but the energy is not distributed to the support substrate 20. The mechanism of confining an acoustic wave by the high acoustic velocity film 3 is the same as or similar to that of a Love wave surface acoustic wave, which is a non-leaky SH wave, and is described in, for example, a document "Introduction to Surface Acoustic Wave Device Simulation Technology", Hashimoto Kenya, Realize Co., Ltd., pp. 26-28. The above-described mechanism is different from a mechanism of confining an acoustic wave using a Bragg reflector based on an acoustic multilayer film.

The material of the high acoustic velocity film 3 is, for example, at least one kind of material selected from the group consisting of diamond-like carbon, aluminum nitride, aluminum oxide, silicon carbide, silicon nitride, silicon, sapphire, a piezoelectric body (lithium tantalate, lithium niobate, or crystal), alumina, zirconia, cordierite, mullite, steatite, forsterite, magnesia, and diamond. The material of the high acoustic velocity film 3 may be a material including any of the above-described materials as a main component or a material including a mixture of any of the above-described materials as a main component.

Regarding the thickness of the high acoustic velocity film 3, since the high acoustic velocity film 3 confines an acoustic wave in the piezoelectric layer 5 and the low acoustic velocity film 4, it is preferable that the thickness of the high acoustic velocity film 3 is as large as possible. The piezoelectric substrate 2d may include an adhesive layer, a dielectric film, or the like as a film other than the high acoustic velocity film 3, the low acoustic velocity film 4, and the piezoelectric layer 5.

The above-described Preferred Embodiments 1 to 4 and the like are merely examples of various preferred embodiments of the present invention. The above-described Preferred Embodiments 1 to 4 and the like can be variously modified in accordance with the design and the like as long as the advantageous effects of the present invention can be achieved.

For example, the electrode 60 of the acoustic wave device 1c according to Preferred Embodiment 3 and the electrode 60 of the acoustic wave device 1d according to Preferred Embodiment 4 are the same or substantially the same as the electrode 60 of the acoustic wave device 1 according to Preferred Embodiment 1, but not limited thereto, and may be the electrode 60 of the acoustic wave device 1a according to Modification 1 of Preferred Embodiment 1 or the electrode 60 of the acoustic wave device 1b according to Preferred Embodiment 2.

In addition, in the method of manufacturing the acoustic wave device 1, the laminated film defining and functioning as a base of the electrode 60 is formed using, for example, the vapor deposition method and the lift-off method, but is not limited thereto, and may be formed using, for example, a vapor deposition method or a sputtering method, a photolithography technique, and an etching technique.

In addition, the acoustic wave devices 1, 1a, and 1b may be, for example, a ladder filter including a plurality of IDT electrodes 6 on the piezoelectric substrate 2, or a longitudinally coupled resonator filter. In addition, the acoustic wave devices 1c and 1d may be ladder filters including the plurality of IDT electrodes 6 on the piezoelectric substrates 2c and 2d, or longitudinally coupled resonator filters.

In addition, in the acoustic wave device 1c according to Preferred Embodiment 3 or the acoustic wave device 1d according to Preferred Embodiment 4, the piezoelectric layer 5 may be provided directly on the support substrate 20.

The following aspects are disclosed in this specification.

An acoustic wave device (1; 1a; 1c; 1d) according to a preferred embodiment of the present invention includes a piezoelectric substrate (2; 2c; 2d) and an electrode (60). The electrode (60) is on a piezoelectric substrate (2; 2c; 2d). The electrode (60) includes a first layer (601) and a second layer (602). The first layer (601) includes Al and Cu. The second layer (602) is on the side opposite to the piezoelectric substrate (2; 2c; 2d) side of the first layer (601) and includes Al. The first layer (601) includes an Al crystal (611) and at least a portion of $CuAl_2$ crystal grains (612) that are provided in a direction orthogonal or substantially orthogonal to a thickness direction (D1) of the piezoelectric substrate (2; 2c; 2d). In the electrode (60), the $CuAl_2$ crystal grains (612) do not extend to the main surface (621) of the second layer (602) on the side opposite to the first layer (601) side.

In the acoustic wave device (1; 1a; 1c; 1d) described above, it is possible to improve power durability while reducing or preventing a decrease in characteristics.

In an acoustic wave device (1; 1a; 1c; 1d) according to a preferred embodiment of the present invention, a Cu concentration of the first layer (601) is higher than a Cu concentration of the second layer (602).

In the acoustic wave device (1; 1a; 1c; 1d) described above, power durability can be more easily improved.

In an acoustic wave device (1; 1a; 1c; 1d) according to a preferred embodiment of the present invention, a Cu concentration of the first layer (601) is equal to or more than about 15 wt %.

In the acoustic wave device (1; 1a; 1c; 1d) described above, it is easy to improve power durability.

In an acoustic wave device (1; 1a; 1c; 1d) according to a preferred embodiment of the present invention, a Cu concentration of the first layer (601) is equal to or less than about 30 wt %.

In the acoustic wave device (1; 1a; 1c; 1d) described above, the electric resistance of the electrode (60) can be prevented from becoming excessively large.

In an acoustic wave device (1; 1a; 1c; 1d) according to a preferred embodiment of the present invention, a Cu concentration of the second layer (602) is equal to or less than about 10 wt %.

In the acoustic wave device (1; 1a; 1c; 1d) described above, the electric resistance of the electrode (60) can be prevented from becoming excessively large.

An acoustic wave device (1b) according to a preferred embodiment of the present invention includes the piezoelectric substrate (2; 2c; 2d) and the electrode (60). The electrode (60) is on the piezoelectric substrate (2; 2c: 2d). The electrode (60) includes the first layer (601) and the second layer (602). The first layer (601) includes Al and Cu. The second layer (602) is on the side opposite to the piezoelectric substrate (2; 2c; 2d) side of the first layer (601), and includes Cu. The first layer (601) includes the Al crystal (611) and the $CuAl_2$ crystal grains (612) that are provided in a direction orthogonal or substantially orthogonal to the thickness direction (D1) of the piezoelectric substrate (2; 2c; 2d). In the electrode (60), the $CuAl_2$ crystal grains (612) do not extend the main surface (621) of the second layer (602) on the side opposite to the first layer (601) side.

In the acoustic wave device (1b) described above, it is possible to improve power durability while reducing or preventing deterioration in characteristics.

In an acoustic wave device (1; 1a; 1b; 1c; 1d) according to a preferred embodiment of the present invention, the electrode (60) further includes an intermediate layer (603). The intermediate layer (603) is between the first layer (601) and the second layer (602). A material of the intermediate layer (603) includes at least one of Ti, Cr, NiCr, Mo or AlTi.

In the acoustic wave device (1; 1a; 1b; 1c; 1d) described above, diffusion between the first layer (601) and the second layer (602) can be reduced or prevented, and power durability can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a piezoelectric substrate; and
an electrode on the piezoelectric substrate; wherein
the electrode includes:

a first layer including Al and Cu; and
a second layer on a side opposite to a piezoelectric substrate side of the first layer and includes Al;
the first layer includes an Al crystal and at least a portion of $CuAl_2$ crystal grains that are provided in a direction orthogonal or substantially orthogonal to a thickness direction of the piezoelectric substrate;
the $CuAl_2$ crystal grains do not extend to a main surface of the second layer on a side opposite to a first layer side in the electrode; and
no $CuAl_2$ crystal grains are exposed from the second layer at the main surface of the second layer.

2. The acoustic wave device according to claim 1, wherein a Cu concentration of the first layer is greater than a Cu concentration of the second layer.

3. The acoustic wave device according to claim 2, wherein a Cu concentration of the first layer is equal to or more than about 15 wt %.

4. The acoustic wave device according to claim 3, wherein a Cu concentration of the first layer is equal to or less than about 30 wt %.

5. The acoustic wave device according to claim 1, wherein a Cu concentration of the second layer is equal to or less than about 10 wt %.

6. The acoustic wave device according to claim 1,
wherein the electrode further includes an intermediate layer located between the first layer and the second layer, and
a material of the intermediate layer includes a material selected from a group of Ti, Cr, NiCr, Mo and AlTi.

7. The acoustic wave device according to claim 2, wherein a Cu concentration of the second layer is equal to or less than about 10 wt %.

8. The acoustic wave device according to claim 3, wherein a Cu concentration of the second layer is equal to or less than about 10 wt %.

9. The acoustic wave device according to claim 4, wherein a Cu concentration of the second layer is equal to or less than about 10 wt %.

10. The acoustic wave device according to claim 2,
wherein the electrode further includes an intermediate layer located between the first layer and the second layer, and
a material of the intermediate layer includes a material selected from a group of Ti, Cr, NiCr, Mo and AlTi.

11. The acoustic wave device according to claim 3,
wherein the electrode further includes an intermediate layer located between the first layer and the second layer, and
a material of the intermediate layer includes a material selected from a group of Ti, Cr, NiCr, Mo and AlTi.

12. The acoustic wave device according to claim 4,
wherein the electrode further includes an intermediate layer located between the first layer and the second layer, and
a material of the intermediate layer includes a material selected from a group of Ti, Cr, NiCr, Mo and AlTi.

13. The acoustic wave device according to claim 5,
wherein the electrode further includes an intermediate layer located between the first layer and the second layer, and
a material of the intermediate layer includes a material selected from a group of Ti, Cr, NiCr, Mo and AlTi.

14. An acoustic wave device comprising:
a piezoelectric substrate; and
an electrode on the piezoelectric substrate; wherein
the electrode includes:
a first layer including Al and Cu; and
a second layer on a side opposite to a piezoelectric substrate side of the first layer and including Cu;
the first layer includes an Al crystal and $CuAl_2$ crystal grains that are provided in a direction orthogonal or substantially orthogonal to a thickness direction of the piezoelectric substrate;
the $CuAl_2$ crystal grains do not extend to a main surface of the second layer on a side opposite to a first layer side; and
no $CuAl_2$ crystal grains are exposed from the second layer at the main surface of the second layer.

15. The acoustic wave device according to claim 14,
wherein the electrode further includes an intermediate layer located between the first layer and the second layer, and
a material of the intermediate layer includes a material selected from a group of Ti, Cr, NiCr, Mo and AlTi.

* * * * *